(12) United States Patent
Fullerton

(10) Patent No.: US 8,744,809 B2
(45) Date of Patent: Jun. 3, 2014

(54) SYSTEM AND METHOD FOR SENSING OF A NUCLEAR QUADRUPOLE RESONANCE

(75) Inventor: Larry W. Fullerton, New Hope, AL (US)

(73) Assignee: PNQR LLC, Huntsville, AL (US)

( * ) Notice: Subject to any disclaimer, the term of this patent is extended or adjusted under 35 U.S.C. 154(b) by 347 days.

(21) Appl. No.: 13/208,832

(22) Filed: Aug. 12, 2011

(65) Prior Publication Data

US 2012/0041717 A1 Feb. 16, 2012

Related U.S. Application Data

(60) Provisional application No. 61/401,464, filed on Aug. 13, 2010.

(51) Int. Cl.
*G06F 15/00* (2006.01)
*G01R 33/44* (2006.01)
*G01R 33/36* (2006.01)

(52) U.S. Cl.
CPC .......... *G01R 33/441* (2013.01); *G01R 33/3621* (2013.01)
USPC ................ 702/189; 324/300; 324/307; 702/8

(58) Field of Classification Search
CPC ............. G01R 33/441; G01R 33/3621; G06K 9/3241; G01N 24/084; G01V 3/14
USPC .......... 702/32, 69, 74, 75, 79, 125, 128, 159, 702/176, 189, 8, 115; 324/300, 307
See application file for complete search history.

(56) References Cited

U.S. PATENT DOCUMENTS

| 5,206,592 A * | 4/1993 | Buess et al. ................... 324/307 |
| 6,194,898 B1 * | 2/2001 | Magnuson et al. ........... 324/300 |
| 6,900,633 B2 * | 5/2005 | Sauer et al. ................... 324/307 |
| 7,170,288 B2 | 1/2007 | Fullerton |
| 7,411,392 B2 | 8/2008 | Fullerton |
| 7,696,750 B2 | 4/2010 | Fullerton |
| 2009/0278642 A1 | 11/2009 | Fullerton et al. |

\* cited by examiner

*Primary Examiner* — John H Le
(74) *Attorney, Agent, or Firm* — Venable LLP; Robert S. Babayi

(57) ABSTRACT

An improved system for sensing includes a first signal source for producing an excitation signal for exciting a specimen having a nuclear quadrupole resonance, a signal sampling device for sampling a response signal received from the specimen to produce a plurality of samples, a data storage device for storing a plurality of data corresponding to said plurality of samples; and a processor for time coherently processing the plurality of data to sense the nuclear quadrupole resonance of said specimen. An optional second signal source for producing a probe signal directed at the specimen can also be used, where the response signal corresponds to the probe signal having reflected off the specimen.

16 Claims, 3 Drawing Sheets

SYSTEM AND METHOD FOR SENSING OF A NUCLEAR QUADRUPOLE RESONANCE

CLAIMING BENEFIT OF PRIOR FILED U.S. APPLICATION

This patent application claims the benefit of U.S. Provisional Application Ser. No. 61/401,464 (filed Aug. 13, 2010) the contents of which are hereby incorporated by reference herein.

FIELD OF THE INVENTION

The present invention relates generally to a system and method for sensing a nuclear quadrupole resonance of a specimen. More particularly, the present invention relates to a system and method for sensing a nuclear quadrupole resonance of a specimen using tailored waveforms and coherent signal processing.

BACKGROUND OF THE INVENTION

Nuclear Quadrupole Resonance (NQR) is a well-known spectrographic technique that is used to detect and identify molecular structures by the characteristic NQR of atomic species contained within. Certain atoms' nuclei have the characteristic of absorbing RF energy when exposed to a frequency that causes its nucleus' spin axis to hop between several stable orientations. This is possible only if the particular nucleus has a non-symmetrical charge distribution that permits interaction with the atom's electron cloud non-symmetries. The complexity of these quasi-stable orientations typically leads to a series of closely spaced, narrow line width absorption lines. An example of such a nucleus is the common isotope Nitrogen-14.

This characteristic resonance has been used commercially to positively detect substances such as explosives contained within shipping containers. The method used is to sweep a local RF field through the frequencies of interest and, by using a bridge structure, measure the loading on the RF source as it passes through the resonances and use this information to identify the material under observation.

There are several technical difficulties with this method that limits its usefulness to very short range applications on the order of one meter, whereas it would be very useful to provide much greater range when dealing with materials such as explosives, i.e. tens of meters or further of standoff would be desirable.

Issues with the conventional NQR spectrographic techniques concern the ability to measure very small signals buried within very large ones, and the directionality of the frequencies used to stimulate the specimen under study.

There are two principal conventional NQR techniques. The first one relies on detecting a target's absorption of resonant radio frequency energy from an interrogator tuned to the specimen's resonant frequency. This is usually accomplished with a bridge configuration in which the voltage across a coil of wire acts as an exciter at the interrogating frequency and that voltage is nulled in a bridge circuit at a frequency that is near an expected resonance but not at it. When the exciter's frequency is tuned past a specimen's resonance, a signal appears in one arm of the bridge whose amplitude indicates the degree of absorption by the specimen. A problem with this approach is that the circuit impedance varies with frequency even if there is no resonance due to the reactive elements used in the exciter, and the RF impedance of the specimen may also vary as the frequency is swept during analysis. These effects conspire to limit the sensitivity of a spectrometer using this approach, a limitation that is typical of any spectrometric technique that uses the same frequency to interrogate as that to which the detector is sensitive. Examples of spectrometers for which this is not so are Raman and florescence spectroscopy, in which the illumination frequency is very different than the response of the specimen, so the illuminator can easily be filtered out and the detector can therefore be made very sensitive to the alternate frequency since it is not blinded by its interrogator.

The second major type of conventional NQR spectrometer is based on producing an echo from the sample. In this method the interrogator emits a pulse of resonant frequency energy toward a specimen under study, and then its receiver listens for immediate re-emission of the same frequency energy when the interrogator is turned off. This mode is less prone to blinding by the interrogator but is less sensitive over all because of three effects. First, the average energy available to excite the specimen is lowered by the duty cycle of the system. Second, its noise figure is worsened by the necessity to pass wide band RF pulses thereby increasing the level of thermal noise in the receiver. The latter effect is particularly bad since the resonances can have bandwidths of single Hertz while the millisecond time delay of the echo mandates a minimum bandwidth of several kilohertz, increasing the noise figure on the order of 30 dB. The third problem with the echo approach is the very high transmit/receive signal loss. The amount of RF energy stored up to be reemitted is quite small, so it is a weak signal with which to start.

All of the resonances of nuclei that are of interest occur below about 1 GHz. Nuclei that resonate toward the high end of this range may benefit from directional interrogators but many important species occur in the hundreds of KHz to a few 10's of MHz. Nitrogen 14 is particularly important to the detection and identification of hidden explosives and these are in the few MHz range and below. Antennas that operate in this range are either very large or will experience very poor directionality. Thus, even if a stand-off system is constructed that overcomes the sensitivity limitations previously described it will typically not be able to resolve its location in the field with sufficient accuracy to locate it.

Atmospheric and man-made noise in this frequency range is far above thermal limits so even if the system is ideally constructed its sensitivity may be further limited by ambient rather than system noise.

These factors combined yield a very short range of operation, and commercial systems therefore operate in near proximity to the target, on the order of 1 meter or less range. This range is entirely unsatisfactory for many applications such as locating hidden explosives that are connected to trip wires.

Therefore there is a need for an improved system and method for sensing a nuclear quadrupole resonance of a specimen.

SUMMARY OF THE INVENTION

Briefly, according to the present invention, a system and method for sensing comprises a first signal source for producing an excitation signal for exciting a specimen having a nuclear quadrupole resonance. In one embodiment, the excitation signal has a prescribed phase angle and a prescribed frequency corresponding to the nuclear quadrupole resonance. A signal sampling device samples a response signal received from said specimen. The signal sampling device produces a plurality of samples that are stored a data storage device for storing a plurality of data corresponding to the plurality of samples. A processor time coherently processes the plurality of data to sense nuclear quadrupole resonance of the specimen. In one embodiment, the plurality of data comprises at least one of the plurality of samples or averages of the plurality of samples According to some of the more detailed features of the invention, the processor controls the first signal source and the signal sampling device, thereby controlling the exciting of the specimen and the sampling of the response signal. More specifically, in one embodiment. The processor integrates the plurality of samples to produce an integrated signal having a signal-to-noise ratio. In another embodiment, the processor repeats its controlling function until the signal-to-noise ratio meets a criteria. Still in another embodiment, a second signal source produces a probe signal directed to the specimen, said the response signal is the probe signal after having reflected off said specimen.

According to yet another embodiment, the system further comprises a coil and a switch for switching the connectivity of the coil between the signal source and signal sampling device. The processor controls the first signal source, signal sampling device, and switch thereby controlling the exciting of the specimen and the accumulating of the response signal. The switch connects the coil to first signal source at a first time and the excitation signal is produced at a second time. The excitation signal is maintained for a first period of time and stopped at a third time. The switch connects the coil to the signal sampling device at a fourth time, and the signal sampling device samples the response signal for a second period of time to produce the plurality of samples, which corresponding to a plurality of sample time offsets from the third time. In one embodiment, the excitation signal is nonexistent between the first time and second time.

A method for sensing according to the invention excites a specimen having a nuclear quadrupole resonance and samples a response signal received from the specimen to produce a plurality of samples. A plurality of data corresponding to said plurality of samples are stored and time coherently processed to sense nuclear quadrupole resonance of the specimen. The method can further include integrates the plurality of samples to produce an integrated signal having a signal-to-noise ratio

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
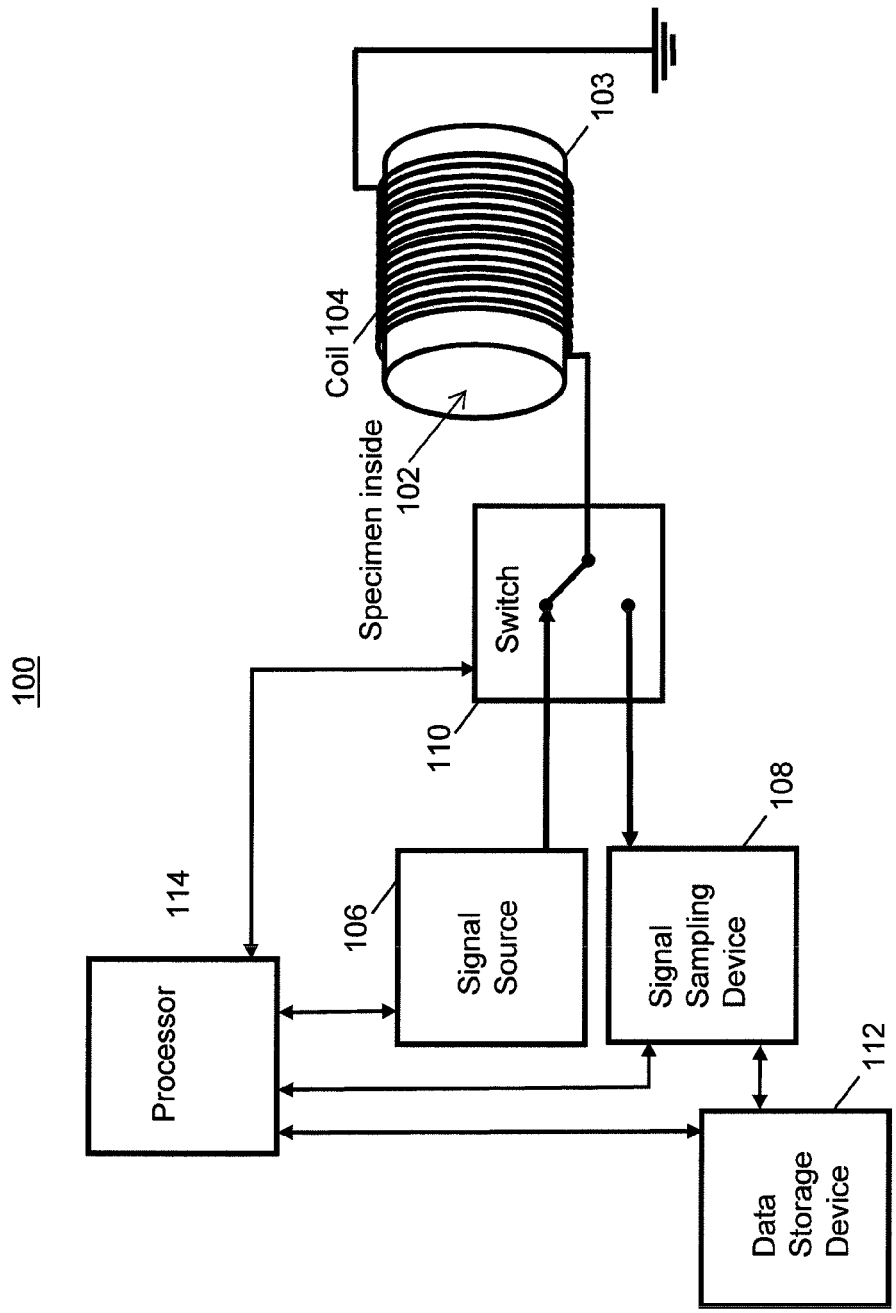
FIG. 1 depicts an exemplary system 100 in accordance with an embodiment of the invention including a specimen 102 inside a container 103 having a coil 104 around it, a signal source 106, a signal sampling device 108, a switch 110, a data storage device 112, and a processor 114.
Figure 2:
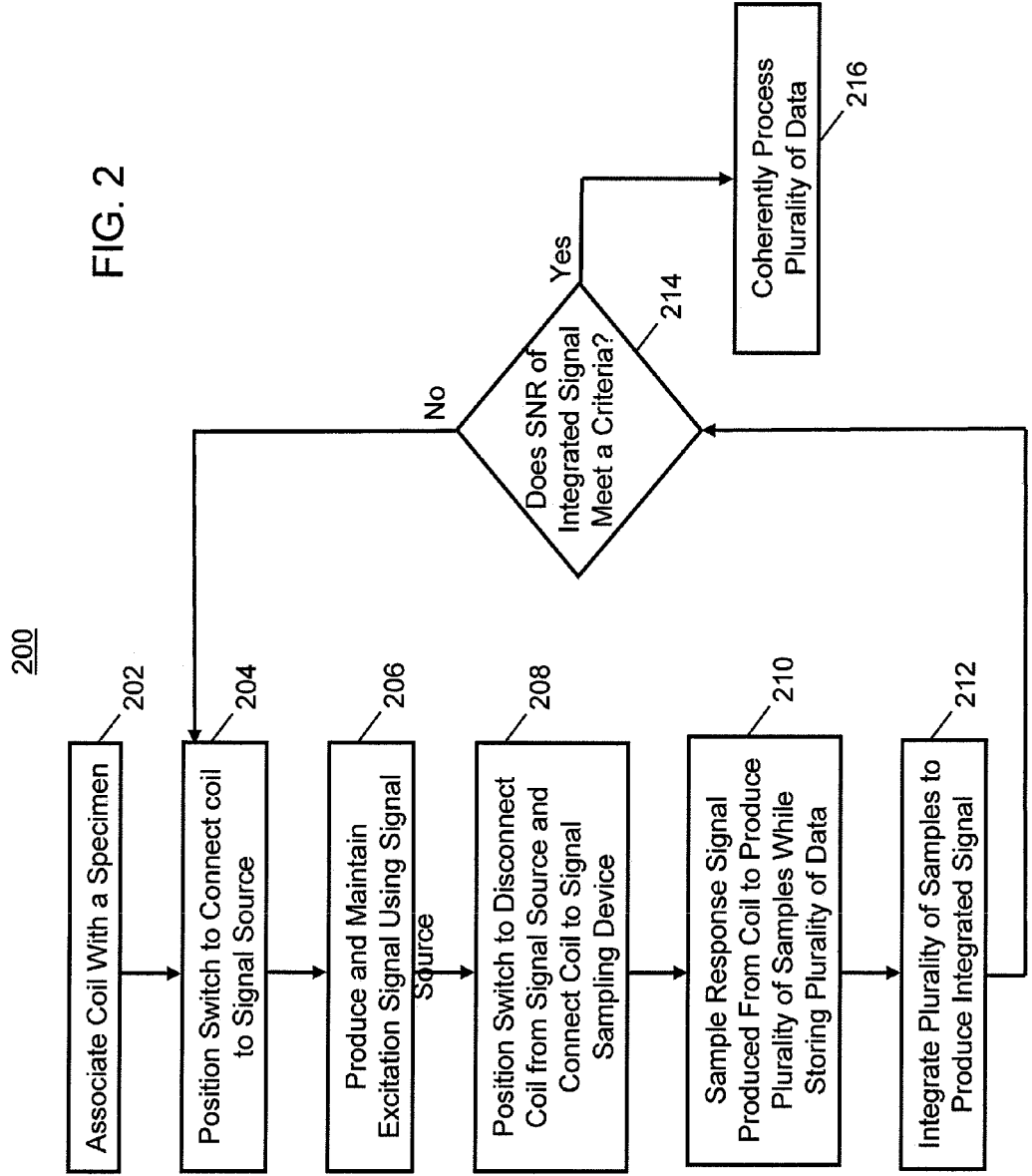
FIG. 2 depicts an exemplary method 200 in accordance with another embodiment of the invention.

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art.

The present invention provides an improved system and method for sensing a nuclear quadrupole resonance of a specimen that involves producing a signal for repeatedly exciting a specimen having a prescribed phase angle and a prescribed frequency corresponding to the nuclear quadrupole resonance of a specimen of interest, accumulating a response signal produced by the specimen over time, and coherently processing the accumulated response signal.

In accordance with a first embodiment of the invention, a system for sensing of a nuclear quadrupole resonance of a specimen comprises:

a coil associated with said specimen, a signal source for producing an excitation signal for exciting said specimen when connected to said coil, said excitation signal having a prescribed phase angle and a prescribed frequency corresponding to said nuclear quadrupole resonance of said specimen;

a signal sampling device for sampling a response signal received from said specimen when connected to said coil;

a switch for switching the connectivity of said coil between said signal source and said signal sampling device, said switch connecting said coil to said signal source at a first time, said excitation signal being produced at a second time, said excitation signal being nonexistent between said first time and said second time, said excitation signal being maintained for a first period of time and stopped at a third time, said switch connecting said coil to said signal sampling device at a fourth time, said signal sampling device sampling said response signal for a second period of time to produce a plurality of samples corresponding to a plurality of sample time offsets from said third time;

a data storage device for storing a plurality of data corresponding to said plurality of samples; and a processor, said processor controlling said signal source, said signal sampling device, and said switch thereby controlling exciting of said specimen and the accumulating of a response signal until a signal-to-noise ratio meets a criteria, said processor also controlling the storage of said plurality of data, said processor integrating said plurality of samples to produce an integrated signal having said signal-to-noise ratio, said processor coherently processing said plurality of data to sense said nuclear quadrupole resonance of said specimen.

Under one arrangement, said exciting said specimen and accumulating said signal comprises positioning said switch to a first position that connects said coil to signal source at a first time, said signal source producing an excitation signal after said switch is in said first position, said excitation signal being produced at a second time, said excitation signal being nonexistent when said switch is not in said first position, said excitation signal having a prescribed phase angle and a prescribed frequency, said excitation signal being maintained for a first period of time and stopped at a third time, said switch being positioned into a second position that disconnects the coil from said signal source and connects said coil to said signal sampling device, said switch being positioned at said second position at a fourth time, said specimen causing said coil to produce a response signal, said signal sampling device sampling said response signal for a second period of time to produce a plurality of samples corresponding to a plurality of sample time offsets from said third time while a plurality of data corresponding to said plurality of samples is stored using said data storage device, and said processor integrating said plurality of samples to produce an integrated signal having said signal-to-noise ratio.

In a preferred embodiment, the coil has a high Q and surrounds the specimen, the switch is a solid state switch, and the signal source is a signal synthesizer, which is a direct signal synthesizer that can be programmed with a specific waveform. The system also includes an amplifier, where the gain setting of the amplifier corresponds to the amplitude of the transient response of the switch. The signal source decays said excitation signal to a zero signal over a third period of time to suppress a transient response. The third period of time may be dependent on decay time characteristics of the specimen. The decaying of said excitation signal would typically occur at a prescribed rate. The prescribed rate can be in accordance with a weighting function, such as an exponential function, a linear function, a Hamming function, a Hanning function, a cosine squared function, or a raised cosine function, which is applied to the synthesized waveform using any of various methods, for example, uploading from a computer.

In accordance with another embodiment of the invention, the method for sensing of a nuclear quadrupole resonance of a specimen comprises the steps of:

a. positioning a switch to a first position that connects a coil associated with a specimen to a signal source, said switch being positioned at said first position at a first time;
b. producing an excitation signal at said signal source after said switch is in said first position, said excitation signal being produced at a second time, said excitation signal being nonexistent when said switch is not in said first position, said excitation signal having a prescribed phase angle and a prescribed frequency corresponding to said nuclear quadropole resonance of said specimen;
c. maintaining said excitation signal for a first period of time and stopping said excitation signal at a third time;
d. positioning said switch into a second position that disconnects the coil from said signal source and connects said coil to a signal sampling device, said switch being positioned at said second position at a fourth time, said specimen causing said coil to produce a response signal;
e. sampling said response signal for a second period of time to produce a plurality of samples corresponding to a plurality of sample time offsets from said third time while storing a plurality of data corresponding to said plurality of samples;
f. integrating said plurality of samples to produce an integrated signal having a signal-to-noise ratio;
g. repeating steps a through f until said signal-to-noise ratio meets a criteria; and
h. coherently processing said plurality of data.

Under one arrangement, the second time occurs at a zero crossing of the excitation signal.

Under another arrangement, the third time occurs at a zero crossing of the excitation signal.

Under still another arrangement, the coherently processing said plurality of data corresponds to performing a Fast Fourier Transform function.

Under an alternative arrangement, the coherently processing said plurality of data corresponds to performing a wavelet function.

Said plurality of data may comprise said plurality of samples.

Additionally or alternatively, said plurality of data comprises averages of said plurality of samples.

The second time may correspond to said first time and a first delay time, for example, one microsecond.

The third time may correspond to a phase angle of said excitation signal.

Said third time may occur a third delay time, for example one microsecond, after said second time period.

Preferably, the prescribed frequency corresponds to a nuclear resonance frequency of a specimen.

The method may further comprise the step of decaying said excitation signal to a zero signal over a third period of time, which may be dependent on decay time characteristics of the specimen. The decaying of said excitation signal would typically occur at a prescribed rate. The prescribed rate can be in accordance with a weighting function such as an exponential function, a linear function, Hamming function, Hanning function, raised cosine function, or raised cosine function.

The decaying of said excitation signal suppresses a transient response.

Under another embodiment of the invention, an imaging system and method involves applying a static ambient magnetic field to the specimen to cause the resonance frequency to split into a first frequency component and a second frequency component, said first frequency component being below said resonance frequency by a first frequency offset and said second frequency component being above said resonance frequency by a second frequency offset. Wherein said first frequency offset is substantially equal to said second frequency offset.

This static ambient magnetic field effect can be leveraged in accordance with the present invention whereby a magnetic field gradient is created through the specimen exposing different parts of the specimen to different field vectors each of which will produce first and second frequency components having first and second frequency offsets that indicate where in the magnetic field gradient a material having the resonance frequency resides. Different field vectors can be produced in a number of different ways, for example, using different field strengths, by rotating a magnet (virtually or physically), varying associated shielding, etc.

One or more coils and one or more magnets each having positioning known by a control system can be used as part of the imaging system to precisely locate the different parts of the specimen producing the various first and second frequency components. For a non-moving specimen, at least 3 coils and/or 3 magnets will be required to determine positioning in three dimensions (i.e., to resolve ambiguities). Alternatively, the specimen can be moved by a single coil—magnet configuration at a known rate to determine position.

If more than one magnet is employed then certain arrangements are necessary to avoid producing a composite field that could not be resolved. Under one approach, the multiple magnets would need to be electromagnets where only one is on a given time. Under another approach, multiple permanent magnets would need to move under control of a control system in order to resolve the ambiguity. Similarly, electromagnets could be moved under such control and optionally turned on and off in desired sequences. Furthermore, additionally or alternatively one or more coils could be moved by said control system. Generally, one skilled in the art will recognize that many different variations are possible whereby one or more magnets and/or one or more coils and/or the specimen can be moved to modulate the gradient field. Such movement can be linear or very elaborate such as using a 6 degree of freedom control system.

Under one arrangement, coded magnets are used to increase slope of gradient. Coded magnets are described in U.S. patent application Ser. No. 12/476,952, filed Jun. 2, 2009, titled "A Field Emission System and Method", which is incorporated herein by reference in its entirety.

This imaging system and method of the present invention can employ conventional NQR technology, the improved NQR technology described herein (i.e., using tailored waveforms and coherent signal processing), and Parametric Nuclear Quadrupole Resonance (PNQR) technology as described in U.S. Pat. Nos. 7,170,288, 7,411,392, and 7,696,750, which are all incorporated herein by reference in their entirety.

Figure 3:
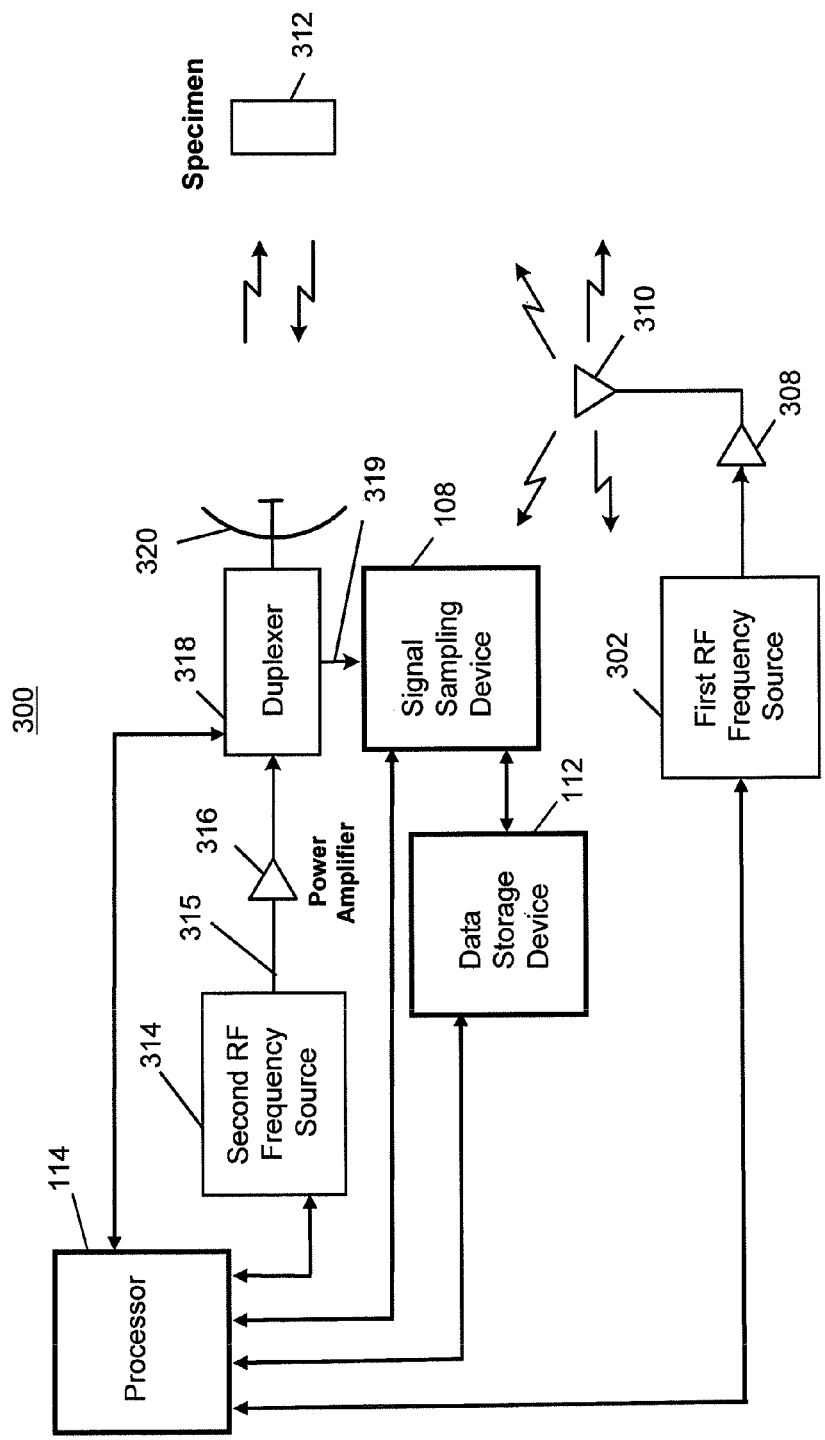
FIG. 3 depicts an exemplary system 300 in accordance with another embodiment of the invention.

The time coherent signal processing techniques of the invention can also be applied to PNQR technology. FIG. 3 illustrates an exemplary PNQR system 300 for exciting the material, probing the material, and detecting the modulated reflection signal in accordance with the present invention. Referring to FIG. 3, a first RF frequency source 302 is tuned to a resonant frequency of interest for a material of interest. The first RF signal is amplified 308 and transmitted via an antenna 310 at a first time as controlled by processor 114. The excitation signal impinges on the specimen 312 and modulates the dielectric constant as described.

A second RF frequency source 314 and amplifier 316 generate a second RF signal (also called a probe signal,) typically at a microwave frequency at a second time as controlled by processor 114. The probe signal is directed to the specimen 312 using a directional antenna 320. A reflected (probe) signal from the specimen is then received by the directional antenna 320 at a third time as controlled by processor 114, coupled through a duplexer or TR Switch 318, and processed by signal sampling device 108. Samples are stored in a data storage device 112 and processed by processor 114 in the manner as described above in relation to NQR system 100, where the processor determines if the reflected signal has been modulated as a result of the excitation signal modulating the dielectric constant of the specimen.

While particular embodiments of the invention have been described, it will be understood, however, that the invention is not limited thereto, since modifications may be made by those skilled in the art, particularly in light of the foregoing teachings.

The invention claimed is:

1. A system for sensing; comprising:
   a first signal source for producing an excitation signal for exciting a specimen having a nuclear quadrupole resonance;
   a signal sampling device for sampling a response signal received from said specimen, said signal sampling device producing a plurality of samples;
   a data storage device for storing a plurality of data corresponding to said plurality of samples; and
   a processor for time coherently processing said plurality of data to sense said nuclear quadrupole resonance of said specimen, wherein said processor controls said first signal source and said signal sampling device, said processor thereby controlling the exciting of said specimen and the sampling of said response signal.

2. The system of claim 1, wherein said processor integrates said plurality of samples to produce an integrated signal having a signal-to-noise ratio.

3. The system of claim 2, wherein said exciting of said specimen, said sampling of said response signal, and said integrating of said plurality of samples to produce an integrated signal having a signal-to-noise ratio is repeated until said signal-to-noise ratio meets a criteria.

4. The system of claim 1, wherein said processor controls the storage of said plurality of data.

5. The system of claim 1, wherein said excitation signal has a prescribed phase angle and a prescribed frequency corresponding to said nuclear quadrupole resonance.

6. The system of claim 1, further comprising a second signal source for producing a probe signal directed to said specimen, said response signal being said probe signal after having reflected off said specimen.

7. The system of claim 1, where said plurality of data comprises at least one of said plurality of samples or averages of said plurality of samples.

8. A system for sensing; comprising:
   a first signal source for producing an excitation signal for exciting a specimen having a nuclear quadrupole resonance;
   a signal sampling device for sampling a response signal received from said specimen, said signal sampling device producing a plurality of samples;
   a data storage device for storing a plurality of data corresponding to said plurality of samples;
   a processor for time coherently processing said plurality of data to sense said nuclear quadrupole resonance of said specimen;
   a coil; and
   a switch for switching the connectivity of said coil between said signal source and said signal sampling device, wherein said processor controls said first signal source, said signal sampling device, and said switch, said processor thereby controlling the exciting of said specimen and the accumulating of said response signal.

9. A system for sensing; comprising:
   a first signal source for producing an excitation signal for exciting a specimen having a nuclear quadrupole resonance;
   a signal sampling device for sampling a response signal received from said specimen, said signal sampling device producing a plurality of samples;
   a data storage device for storing a plurality of data corresponding to said plurality of samples;
   a processor for time coherently processing said plurality of data to sense said nuclear quadrupole resonance of said specimen;
   a coil; and
   a switch for switching the connectivity of said coil between said signal source and said signal sampling device, wherein said switch connects said coil to said first signal source at a first time, said excitation signal being produced at a second time, said excitation signal being maintained for a first period of time and stopped at a third time, said switch connecting said coil to said signal sampling device at a fourth time, said signal sampling device sampling said response signal for a second period of time to produce said plurality of samples, said plurality of samples corresponding to a plurality of sample time offsets from said third time.

10. The system of claim 9, wherein said excitation signal is nonexistent between said first time and said second time.

11. A method for sensing; said method comprising the steps of:
   exciting a specimen having a nuclear quadrupole resonance;
   sampling a response signal received from said specimen to produce a plurality of samples;
   storing a plurality of data corresponding to said plurality of samples; and
   time coherently processing said plurality of data to sense said nuclear quadrupole resonance of said specimen, wherein said exciting of said specimen is maintained for a first period of time and said sampling said of said response signal is maintained for a second period of time to produce said plurality of samples, said plurality of samples time offsets.

12. The method of claim 11, further comprising the step of:
   integrating said plurality of samples to produce an integrated signal having a signal-to-noise ratio.

13. The method of claim 12, wherein said exciting said specimen, said sampling of said response signal, and said integrating of said plurality of samples to produce an integrated signal having a signal-to-noise ratio is repeated until said signal-to-noise ratio meets a criteria.

14. The method of claim 11, wherein said exciting said specimen is by an excitation signal having a prescribed phase angle and a prescribed frequency corresponding to said nuclear quadrupole resonance.

15. The method of claim 11, further comprising the step of:
    directing a probe signal to said specimen, said response signal being said probe signal after having reflected off said specimen.

16. The method of claim 11, where said plurality of data comprises at least one of said plurality of samples or averages of said plurality of samples.

* * * * *